United States Patent [19]

Levy

[11] 4,326,170
[45] Apr. 20, 1982

[54] HIGH POWER AND/OR HIGH VOLTAGE SWITCHING OPERATIONAL AMPLIFIER

[75] Inventor: Allan Levy, Delray Beach, Fla.
[73] Assignee: Siemens Corporation, Iselin, N.J.
[21] Appl. No.: 157,321
[22] Filed: Jun. 9, 1980
[51] Int. Cl.³ .......................... H03F 3/38; H03F 1/34; H03F 3/217
[52] U.S. Cl. ...................................... 330/10; 330/293; 330/207 A; 330/251
[58] Field of Search ..................... 330/10, 207 A, 251, 330/293

[56] References Cited

U.S. PATENT DOCUMENTS 3,636,380  1/1972  Anderson ........................ 330/207 A Primary Examiner—James B. Mullins
Assistant Examiner—Gene Wan
Attorney, Agent, or Firm—Spellman, Joel and Pelton

[57] ABSTRACT

There is disclosed a high power and/or high voltage switching operational amplifier arrangement having a comparator with a first input for a low frequency AC signal. The output of the comparator is connected with the data input of a bistable element. The bistable element is triggered by a clock pulse signal with a rate substantially higher than the frequency of the AC input signal. An amplifying stage arranged between both poles of a high power and/or high voltage source is composed of a pair of alternately operating switch means, each arranged between a respective pole of the voltage source and a common amplifier stage output. Each of the switch means is coupled by a control input to at least one of the outputs of the bistable element. A low pass filter network coupled to the amplifier stage output forms the output stage of the operational amplifier arrangement. Means for providing feedback are arranged between the filter network and a second input of the comparator.

9 Claims, 3 Drawing Figures

HIGH POWER AND/OR HIGH VOLTAGE SWITCHING OPERATIONAL AMPLIFIER

BACKGROUND OF THE INVENTION

The present invention is directed to electric power supply arrangements and in particular to a high power and/or high voltage switching operational amplifier arrangement generating an AC output signal of low frequency.

In a variety of applications in electronic circuit design, a relatively high power or high voltage analog output signal has to be generated by amplifying a low power analog input signal. Furthermore, in some applications the generated high power signal may have to be switched on and off. Known power supply units for electronic circuit arrangements and larger systems have their drawbacks. Large electronic systems still have a reasonable power consumption, sometimes especially because of their high packing density; and heavy duty supply units require too much space and are too heavy in comparison with the associated electronic circuit arrangement. There are several difficulties in designing such a high power and/or high voltage supply unit which difficulties even accumulate in applications when a low frequency output signal of both high power and high voltage has to be generated.

Well known, presently used amplifying arrangements of the described purpose normally have a transformer for changing the voltage of analog input signal. The disadvantage of using a transformer in such a case is its inefficiency for low frequencies. Since the transformer in such a case has to be designed for high inductance it is of relatively large size and of heavy weight. The space requirements and the weight of such a circuit arrangement does not correspond to modern electronic circuit design which is usually of high packing density with reasonable weight.

It is, therefore, an object of the present invention to achieve a high power and/or voltage switching amplifier for low frequency application with less space and weight requirements, thus being better adapted for combination with presently available electronic circuits.

Another object of the present invention is to provide an improved high power and/or high voltage switching amplifier of transformerless design offering undistorted switching capabilities because of relatively small inductances and capacitances.

BRIEF SUMMARY OF THE INVENTION

In accordance with the present invention there is disclosed a high power and/or high voltage switching operational amplifier arrangement having a comparator with a first input for the low frequency AC signal. The output of the comparator is connected with the data input of a bistable element. The bistable element is triggered by a clock pulse signal having a pulse rate substantially higher than the frequency of the AC input signal. The operational amplifier arrangement also comprises an amplifying stage arranged between both poles of a high power and/or high voltage source. The amplifying stage has a pair of amplifier inputs coupled to at least one output of the bistable element, and an output. The amplifying stage is composed of a pair of high power alternately operating switch means, each associated with one pole of the voltage source, for connecting the respective pole to the amplifier output. Each of the switch means has a control input coupled to a respective one of the inputs of the amplifying stage. A low pass filter network connected to the output of the amplifier stage forms the output stage of the operational amplifying stage. Means for providing feedback from the output of the filter network to a second input of the comparator complete a limited continuous regulation scheme.

The comparator delivers an output signal to the data input of the bistable element depending on the respective ratio of the amplitudes of the AC input signal and the signal generated by the feed back network. The bistable element sampling this input signal at the clock pulse rate is set into a respective operation position, i.e. one of its outputs is switched to the high level state and causes the associated switch means of the amplifying stage to become conductive. Current then flows through this conducting switch means either from the positive pole of the supply voltage to the low pass filter network or from that network to the negative pole of the supply voltage. The output signal is also fed back to the second input of the comparator. As soon as the rated feedback signal becomes higher than the AC input signal, the comparator will supply a low level output signal to the bistable element. Accordingly, the bistable element is triggered by the next clock pulse into the opposite signal state. If the sampling rate of the bistable element determined by the clock pulse rate is reasonably higher than the frequency of the AC input signal, the output signal of the amplifying stage will follow the sine wave form of the input signal containing just some amount of jitter which is dependent on the ratio of the AC input signal and the clock pulse rate. Having a reasonable ratio of 0.1 for example, the amount of jitter can be kept sufficiently small, so that it may be filtered in a filter network composed of small inductances and capacitances.

BRIEF DESCRIPTION OF THE DRAWINGS

A better understanding of the invention may be had by reference to the following description of preferred embodiments in conjunction with the accompanying drawings, in which.

DETAILED DESCRIPTION OF THE PREFERRED EMBODIMENTS

Figure 1:
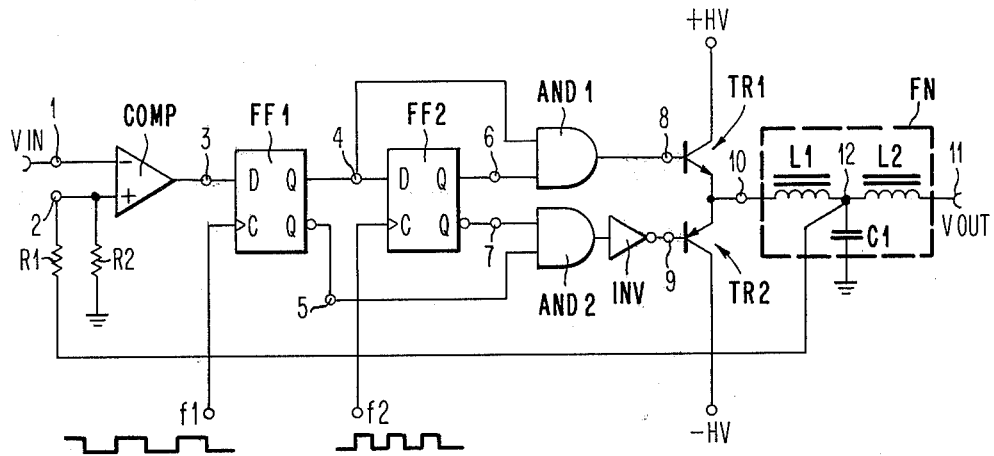
FIG. 1 is a circuit diagram of a basic structure of the high power and/or voltage switching operational amplifier according to the invention.

Referring to FIG. 1 there is arranged at the input side a comparator COMP having two inputs 1 and 2 and an output 3. The first input 1 constitutes the signal input for the low frequency AC signal Vin; a feed-back signal yet to be described is supplied to the second input 2. Output 3 is connected with a data input of a first bistable element FF1 designed as a "D" flip-flop. The first bistable element is triggered by a first clock pulse signal having a first clock pulse rate f1. The bistable element has two outputs 4,5 of opposite signal state; the first output 4 having a signal state corresponding to that at the data input is connected to the data input of the second bistable element FF2 of the same design. The second bistable element is triggered by a second clock pulse signal having a second clock pulse rate f2. The second bistable element FF2 has a third output 6 and a fourth output 7, wherein the signal state of the third output 6 corresponds to the signal state at the respective data input. At the output side of the flip-flops there are arranged two AND-gates AND1 and AND2, each having two inputs and an output. Each input of the first AND-gate AND1 is connected with the corresponding output 4 or 6 of the first and second bistable elements, respectively. Symmetrically, each input of the second AND-gate AND2 is connected with a respective one of the outputs 5 and 7 of the bistable elements. The output signal of the first AND-gate AND1 is sent directly to a first input 8 of the amplifying stage. A second input 9 of this amplifying stage is connected with the output of the second AND-gate AND2 via an inverter INV.

The amplifying stage, schematically represented in FIG. 1 by a pair of power amplifiers TR1 and TR2, is arranged between two poles of a supply voltage HV. Power transistors TR1 and TR2 are of opposite conductivity type. Each collector of both transistors is connected with a respective pole of the high voltage HV. The emitters of both transistors are commonly connected with an output 10 of the amplifying stage. Each base connector of the transistors is connected with a respective one of both inputs 8 and 9 of the amplifying stage.

A signal output 11 delivers an output signal Vout. Between this signal output 11 and the output 10 of the amplifying stage there is arranged a filter network FN composed of a series connection of two inductances L1, L2 and a grounded capacitor C which is commonly connected to both inductances at a connector tap 12. This filter network FN forms a T section having low pass filter characteristics.

There is arranged a feedback network connected to the connector tap 12 of the filter network and comprising two ohmic resistors R1 and R2. The first ohmic resistor R1 is inserted between connector tap 12 and the second input of the comparator COMP. The second resistor R2 is arranged between the second input 2 of the comparator COMP and ground. The ratio of both resistors defines the mode of operation of the comparator COMP. Mode of operation is substantially determined by the rated output signal Vout and the input signal Vin. The equation:

$$V_{out} = -R2/R1 \times V_{in} \quad (1)$$

describes the rating of the output signal Vout by the feedback network.

The basic circuit diagram, as shown in FIG. 1, is best suited for describing the general scheme of operation. It may be understood that the circuit arrangement also would operate without the second bistable element FF2 and the AND-gates AND1 and AND2. The most relevant elements of the circuit arrangement, as described above, are: the comparator COMP for comparing a low power AC input signal with a weighted output signal taken from the output 10 of the amplifying stage; the first bistable element FF1 sampling the signal state of output 3 of the comparator at clock pulse rate f1; the amplifying stage comprising the pair of alternately conducting power transistor switches TR1, TR2; the filter network FN, and the feedback network. Transistor switches TR1 and TR2 operate alternately causing either a current flow from the positive pole of the high supply voltage +HV into the filter network FN or from the filter network across the emitter-collector-path of the second transistor TR2 to the negative pole of the supply voltage −HV. An amplified output signal—i.e. a voltage at the common connecting point 12 of the T-section corresponding to the instantaneous amplitude of the low power AC input signal Vin at input 1—is produced in dependence upon the time constant $\tau = L1/C1$. This voltage increases, as determined by the time constant, until the amplitude value of the signal at connection point 12 rated by the feedback network exceeds the corresponding amplitude of the input signal Vin. At that time, the comparator COMP changes its state, thus causing the first bistable element FF1 to be reset when triggered. Transistors TR1, TR2 are switched. The output signal at output 10 of the amplifying stage decreases as long as this opposite mode of operation is maintained.

This limited continuous regulation scheme means the output signal at output 10 of the amplifying stage will contain some jitter as compared to a pure sine wave AC input signal Vin. The amount of jitter depends on two substantial factors: the time constant $\tau$ and the rate f1 of the clock pulses triggering the first bistable element FF1, if the sampling rate for the input signal Vin is high compared to the frequency of the input signal, the inductances of the filter network FN can be very small since the appropriate time constant $\tau$ depends on the ratio of the clock pulse rate f1 and the frequency of the sine wave AC input signal. The amount of jitter becomes smaller, the better these conditions are met. A reasonably undistorted signal at output 10 of the amplifying stage can be easily filtered by the filter network FN. The output 11 of the filter network forming the output of the entire amplifier arrangement thus delivers an undistorted sine wave output signal Vout with a frequency identical to the frequency of the input Vin without phase distortion.

The described basic design has one restraint: The control of operation of both transistors TR1 and TR2 of the amplifying stage may become somewhat indefinite because of transistor tolerances. During a switching transition phase both transistors could become more or less conductive thus creating a critical condition in case of a high supply voltage HV. For this reason, the second bistable element FF2, AND-gates AND1 and AND2 and inverter INV are inserted between outputs 4 and 5 of the first bistable element FF1 and inputs 8 and 9 of the amplifying stage. These additional elements form a circuit arrangement which is designated as dead zone generator for achieving a dead zone during the transition when the amplifying stage is being switched in its mode of operation. This dead zone is to be understood as a clearly defined time span with both transistors TR1 and TR2 turned off for removing a base load from the previously conducting transistor.

Figure 2:
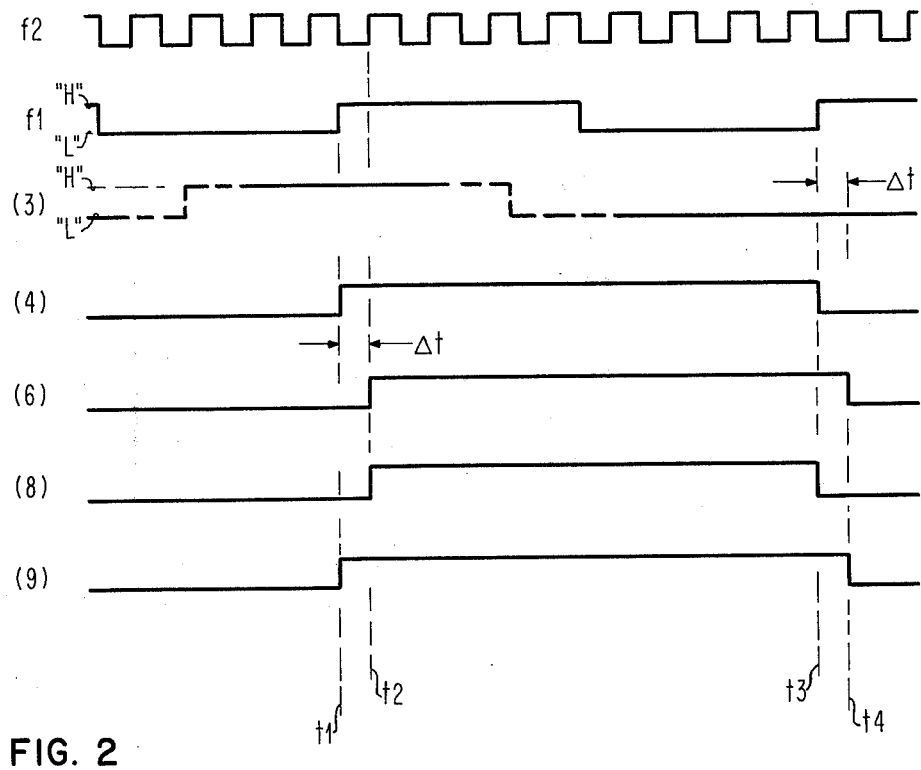
FIG. 2 respresents a set of wave forms showing in detail how the two branches of the amplifying stage are controlled.

The control operation of the circuit arrangement of FIG. 1 will now be described in detail with reference to FIG. 2 showing some wave forms representing signals appearing at different connector points of the circuit arrangement. The first two lines of FIG. 2 represent clock pulses f2 and f1, respectively. The rate of the second clock pulse f2 is higher than the first clock pulse rate f1 and is designed so as to define a time span, the dead zone $\Delta t$, which should be just long enough to fulfill its purpose. In this embodiment, the second clock pulse rate f2 is four times higher than the first clock pulse rate f1.

The third line of FIG. 2 symbolizes the shape of the signal which is generated by the comparator COMP. Transition phases of this signal appearing at connector point 3 are indicated in dotted lines symbolizing that the exact transition times are unknown but unimportant. Significant for the operation, however, is not the transition phase but the quasi-stationary statuses of that signal. A high level signal state "H" at connector point 3 at a time t1, defined by the leading edge of the first clock pulse f2 will set the first bistable element FF1 into a condition where its first output is high. This is to be seen from the wave form of the fourth line representing the signal at the connector point 4. This signal state will be maintained as long as the comparator output signal does not change. It is assumed, as shown in FIG. 2, that the output signal of the comparator COMP changes prior to an instant t3 defined by the leading edge of the next first clock pulse f1. Since at this time the signal condition at the data input fo the first bistabl element FF1 has changed, as assumed, this clock pulse resets the first bistable element FF1.

The fifth line of FIG. 2 represents the corresponding function of the second bistable element FF2; that is the signal state at connector point 6. The signal at connector point 4 just described, also represents the condition at the data input of the second bistable element FF2, which results in a change of state of this element at the time t2 when the leading edge of the next clock pulse f2 triggers this second bistable element. The signal condition at connector 4 is changed at time t3; correspondingly the second bistable element FF2 is reset at time t4 defined by the leading edge of the next clock pulse f2. The mode of operation of the second flip-flop FF2 therefore follows that of the first flip-flop delayed by half a period of the second clock pulse f2, which time span has been designated as the "dead zone" Δt.

Each of the AND-gates AND1 and AND2 logically links the signal conditions at respective outputs of both bistable elements FF1, FF2, as may be seen immediately from the wave form of the sixth line of FIG. 2, representing the signal at connector point 8. This signal can be high only if both signal states at connector points 4 and 6 are high. The respective wave form of the seventh line of FIG. 2 represents the signal at the second input 9 of the amplifying stage. It results from the inverted output signal of the second AND-gate AND2. This signal can be low only as long as the signals at both connector points 5 and 7 are high. Signals shown in the sixth and seventh lines of FIG. 2 control the operation of the amplifying stage and exclude a condition where both transistors may become conductive at the same time because of dead zones Δt during the transition phases of both transistors.

Figure 3:
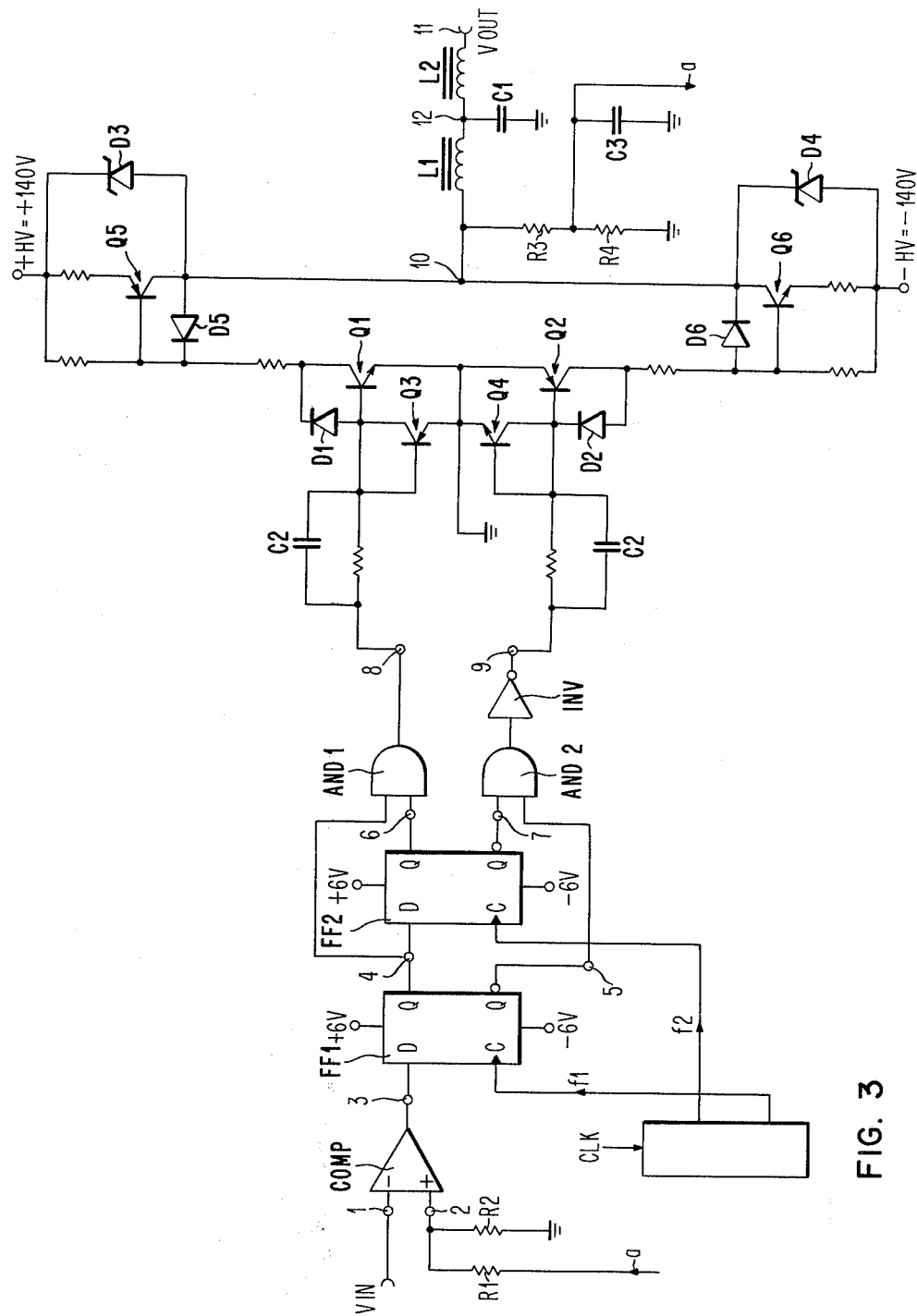
FIG. 3 shows a detailed actual design based upon the structure of FIG. 1.

Having described in detail the principles of the circuit design and operation, the actual design of a preferred embodiment shown in FIG. 3 may be well understood by those skilled in the art without describing again those elements in common with the embodiment of FIG. 1. The circuit design of FIG. 3 substantially shows in more detail the actual layout of the amplifying stage.

Referring to the control parts of the amplifying stage arranged between inputs 1 and 2 of the comparator COMP and the inputs 8 and 9 of the amplifying stage, it may be noted that a counter CTR has been added to the design of FIG. 1.

This counter generates the first and second clock pulses f1, f2 for triggering the bistable elements FF1, Ff2. The counter CTR is controlled by a common clock pulse signal CLK that may be of any conventional design.

The main characteristic of the amplifying stage is a symmetrically arranged structure composed of two identically designed branches, each associated with a respective pole of the voltage source HV. One of these branches composed of three transistors Q1, Q3 and Q5, is arranged between the first input 8 and the positive pole of the supply voltage +HV. The collector-emitter-path of the first transistor Q1 is arranged between the positive pole of the supply voltage +HV and ground. The base connector of the transistor is coupled to the first input 8 of the amplifying stage via a base resistor and a second capacitor C2 both arranged in parallel. The capacitor C2 of the base load network forms a speed-up capacitor for shortening the transition phase of the first transistor when becoming conductive. In parallel to the base-emitter-diode of the first transistor Q1 is arranged the collector-emitter-path of another transistor Q3. Since the base connector of transistor Q3 is also connected to the base connector of the transistor Q1, the base-collector-diode of the transistor Q3 is short-circuited. Both transistors Q1 and Q3 are of opposite conductivity type which means that the base-emitter-diode of the transistor Q3 is forward biased during the turn-off phase of the transistor Q1. The base-emitter-diode of the transistor Q3, therefore, accelerates the switch transistion of the transistor Q1 when being turned off. A reverse-biased protective diode is arranged between the base connector and the collector of transistor Q1 protecting this transistor from an excessive voltage.

To reach the necessary overall gain and short switching times of the amplifying stage there is provided still another transistor Q5; its emitter-collector-path is arranged between the positive pole of the supply voltage HV and the output 10 of the amplifying stage. The base connector of transistor Q5 is coupled to the collector side of the transistor Q1. Transistors Q5 and Q1 are of opposite conductivity type. Therefore, transistor Q5 is switched on as soon as transistor Q1 becomes conductive. Between the positive pole of the supply voltage +HV and the connector on the opposite side of transistor Q5, i.e. its collector, is another diode D3, preferably a zener diode, for protecting the associated transistor Q5 against excessive voltages. Still another diode D5 is arranged in parallel between the collector and the base connector of transistor Q5.

The second branch of the amplifying stage, substantially composed of transistors Q2, Q4 and Q6 with respective load resistors and control elements, especially diodes D2, D4 and D6, is arranged between the negative pole of the supply voltage HV and the common ground connection. Arrangement and design of this second branch are symmetrical to those of the first branch. Detailed description, therefore, does not seem to be necessary.

In the same manner as in the basic structure, shown in FIG. 1, the filter network FN composed of a T-section of the two inductances L1, L2 and the ground connected capacitor C1 is arranged between the output 10 of the amplifying stage and the signal output 11 of the entire circuit arrangement. In this embodiment output 10 of the amplifying stage is connected to ground via a voltage divider consisting of two ohmic resistors R3 and R4. In parallel to resistor 4 there is arranged another filter capacitor C4 for filtering out high frequency jitter components from the signal at the connector tap.

In this embodiment resistor R3 and capacitor C3 form the filter network for deriving the undistorted feedback signal. As indicated by arrows designated with symbol a, the connector tap of the voltage divider R3, R4 is coupled to the second input of the comparator COMP by a feedback line.

There has thus been shown and described a novel high power and/or high voltage switching operational amplifier arrangement which fulfills all the objects and advantages sought therefore. Many changes, modifications, variations and other uses and applications of the subject invention will, however, become apparent to those skilled in the art after considering this specification and the accompanying drawings which disclose preferred embodiments thereof.

Those modifications may refer to the application of a dead zone generator and the specific design including the choice of proper clock pulse rates as well as to design details of the amplifying stage or the filter network. Many adjustments could be made for obtaining the main characteristic. For example, the ratio of the first clock pulse rate and the frequency of the low power AC input signal preferably should not be less than 10 to allow the design of filter networks with small inductances for achieving a proper undistorted shape of the high power and/or high voltage output signal. Furthermore, the rate of the second clock pulse should be substantially higher than that of the first clock pulse for achieving a small dead zone. On the other hand, the second clock pulse rate should not be too high and has to be chosen according to the tolerances of the power transistors and the respective control and load network to meet the objective. A variety of changes may be made in designing the amplifying stage. The described embodiments are preferred because a symmetrical structure achieves the smallest distortions of the shape of the high power output signal.

Changes, modifications and variations and other uses and applications which do not depart from the spirit and scope of the invention are deemed to be covered by the invention which is limited only by the claims which follow.

What is claimed is:

1. A switching operational amplifier comprising:
   (a) a comparator having a first input, a second input and an output, said first input constituting the signal input for an AC input signal;
   (b) a first bistable element having a data input, a first output and a second output of opposite signal state to the first output, wherein the signal state of the first output corresponds to the signal state of said data input, said data input of said bistable element being connected with the output of said comparator, said bistable element being triggered by a clock pulse signal having a pulse rate substantially higher than the frequency of the AC input signal;
   (c) an amplifier stage having a pair of amplifier inputs each coupled to a different one of said first and second outputs of said bistable element and an amplifier output; and having a pair of alternately operating switch means, each of said switch means being connected by a control input to a respective one of said amplifier inputs and each being connected to said amplifier output and one of said switch means having an input terminal for connection to a positive voltage source and the other of said switch means having an input terminal for connection to a negative voltage source;
   (d) a filter network having an input and an output, said input of the filter network connected to said amplifier output for integrating an output signal appearing at said amplifier output; and
   (d) means for providing feedback from the output of said filter network to said second input of said comparator.

2. The switching operational amplifier arrangement as recited in claim 1, wherein the switch means of the amplifier stage further comprise:
   first and second high power amplifying transistors of opposite conductivity types having base connectors, collectors and emitters, said transistors being arranged in series via a connector tap with regard to their respective emitter-collector-paths between the positive pole and the negative pole of said supply voltage, and each of said base connectors being coupled to a respective one of said outputs of said bistable element for controlling the alternate mode of operation of both transistors.

3. The switching operational amplifier arrangement as recited in claim 2, wherein said amplifying stage further comprises a third and fourth transistor each arranged between the respective outputs of said first bistable element on one hand and the respective base connectors of the first and second transistor on the other hand; and each transistor constitutes a pre-amplifying circuit for the associated one of said first and second transistor.

4. The switching operational amplifier arrangement as recited in claim 3, wherein the pre-amplifying circuits further comprise said third and fourth transistor being composed of an n-p-n transistor and a p-n-p transistor, respectively, arranged in complementary connection; said complementary connection connected to respective load resistor networks which, in turn, are connected to the positive pole and the negative pole of the supply voltage source, respectively, and each of said load resistor networks is connected to the respective base connector of the first and the second transistor.

5. The switching operational amplifier as recited in claim 3, wherein the pre-amplifying circuits each further comprise a base resistor and a capacitor connected in parallel to said base resistor, said base resistor and said capacitor being connected between the respective outputs of said bistable element and the respective third and fourth transistors.

6. The switching operational amplifier arrangement as recited in claim 2, wherein the amplifying stage arranged between the respective outputs of the first bistable element on one hand and the supply voltage source on the other hand furthermore comprises:
   (a) the first and the second transistor being composed of a p-n-p transistor and a n-p-n transistor, respectively, the emitters of said first and second transistor being connected to a respective emitter resistor and, in turn, to the respective pole of the supply voltage source; and the collectors of said first and second transistor being commonly connected to the filter network;
   (b) a first and a second protective diode, each arranged in parallel to said emitter resistor and the emitter-collector-path of said first and second transistor, respectively, and said diode being biased in reverse direction;
   (c) a first and a second pre-amplifying stage composed of a third transistor designed as an n-p-n transistor and a fourth transistor designed as a p-n-p transistor, respectively; both transistors having emitters commonly connected to ground, collectors connected to a respective load resistor network and base connectors; each of said load resistor networks of the third and fourth transistor being connected to the positive and the negative pole of the supply voltage source, respectively and to the base connectors of said first and second transistor, respectively;

(d) a fifth transistor designed as p-n-p transistor and a sixth transistor designed as n-p-n transistor, both transistors having emitters commonly connected to ground, collectors and base connectors, the collectors and the base connector of the fifth transistor commonly connected to the base connector of the third resistor; and the collector and the base connector of the sixth transistor commonly connected to the base connector of the fourth transistor; and (f) parallel RC-circuits, each assigned to a respective one of said pre-amplifying stages and each arranged between the respective base connector of the third and the fourth transistor respectively, on the one hand, and the output of the first AND-gate and the inverter, respectively on the other hand.

7. The switching operational amplifier arrangement as recited in claim 2, further comprising control means for deriving from output signals of the first bistable element control signals for controlling both transistors of the amplifying stage such that a dead zone is maintained between successive switch-on positions of said transistors.

8. The switching operational amplifier arrangement as recited in claim 7, further comprising:

(a) a second bistable element having a second data input connected to the first output of the first bistable element, a third and a fourth output of opposite signal state and being triggered by a second clock pulse of a second clock pulse rate substantially higher than the first pulse rate, wherein the signal state of said third output corresponds to the signal state at the second data input;

(b) a first and a second AND-gate each having a pair of inputs and an output; each input of said first AND-gate being connected to a respective one of the first output and the third output and each input of said second AND-gate being connected to respective one of the second output and the fourth output; and (c) an inverter connected to the output of the second AND-gate;

wherein the output of said first AND-gate and the output of said inverter are coupled to a respective one of the base connectors of said transistors of said amplifying stage.

9. The switching operational amplifier arrangement as recited in claim 8, comprising a clock pulse generating device composed of a binary counter element having outputs and a clock pulse input for receiving a main clock pulse triggering said counter element; and two of said outputs of the counter element being connected to a respective one of the clock pulse inputs of the first and the second bistable element.

* * * * *